United States Patent
Nishida

(10) Patent No.: US 10,348,317 B2
(45) Date of Patent: Jul. 9, 2019

(54) QUANTUM INTERFERENCE DEVICE, ATOMIC OSCILLATOR, ELECTRONIC APPARATUS, AND MOVING OBJECT

(71) Applicant: Seiko Epson Corporation, Tokyo (JP)

(72) Inventor: Tetsuo Nishida, Suwa (JP)

(73) Assignee: Seiko Epson Corporation (JP)

( * ) Notice: Subject to any disclaimer, the term of this patent is extended or adjusted under 35 U.S.C. 154(b) by 197 days.

(21) Appl. No.: 15/421,742

(22) Filed: Feb. 1, 2017

(65) Prior Publication Data

US 2017/0244420 A1  Aug. 24, 2017

(30) Foreign Application Priority Data

Feb. 24, 2016  (JP) .................. 2016-032756

(51) Int. Cl.
    *G02B 5/20* (2006.01)
    *G04F 5/14* (2006.01)
    *H03L 7/26* (2006.01)

(52) U.S. Cl.
    CPC .................. *H03L 7/26* (2013.01); *G02B 5/20* (2013.01); *G04F 5/145* (2013.01)

(58) Field of Classification Search
    CPC ... G04F 5/145; G04F 5/14; H03L 7/26; H01S 5/0687; H01S 2301/163; H01S 5/0078; H01S 5/18394; G02B 5/20
    See application file for complete search history.

(56) References Cited

U.S. PATENT DOCUMENTS

| 6,320,472 B1 * | 11/2001 | Vanier | G04F 5/145 331/94.1 |
| 2004/0028103 A1 | 2/2004 | Ueki | |
| 2010/0124245 A1 | 5/2010 | Kobayashi | |
| 2014/0232479 A1 * | 8/2014 | Maki | H01S 1/06 331/94.1 |
| 2014/0293551 A1 * | 10/2014 | Chindo | H01S 5/0687 361/728 |

FOREIGN PATENT DOCUMENTS

| JP | 2006-237648 A | 9/2006 |
| JP | 2010-123630 A | 6/2010 |
| JP | 2013-125907 A | 6/2013 |
| JP | JP-2014157915 A * | 8/2014 |

* cited by examiner

*Primary Examiner* — Ryan Johnson
(74) *Attorney, Agent, or Firm* — Harness, Dickey & Pierce, P.L.C.

(57) ABSTRACT

A quantum interference device (atomic oscillator) includes a light source unit as a coherent light source, a unit that superimposes microwave on the light source unit to generate a side band, an atom cell in which an alkali metal gas is enclosed, and a light receiving unit that detects light transmitted through the atom cell, wherein the light source unit is a surface-emitting laser that outputs a zero-order mode light and a plurality of higher-order mode lights, and a mode filter that cuts the higher-order mode lights is placed between the light source unit and the atom cell.

16 Claims, 9 Drawing Sheets

QUANTUM INTERFERENCE DEVICE, ATOMIC OSCILLATOR, ELECTRONIC APPARATUS, AND MOVING OBJECT

BACKGROUND

1. Technical Field

The present invention relates to a quantum interference device, an atomic oscillator, an electronic apparatus, and a moving object.

2. Related Art

As oscillators having high-accuracy oscillation characteristics on a long-term basis, atomic oscillators that oscillate based on energy transition of atoms of alkali metals including rubidium and cesium are known.

Generally, the operation principle of the atomic oscillators is roughly classified into a system using a double resonance phenomenon by light and microwave and a system using a quantum interference effect (CPT: Coherent Population Trapping) by two kinds of lights having different wavelengths. The atomic oscillators using the quantum interference effect may be made smaller than the atomic oscillators using the double resonance phenomenon, and have been recently expected to be mounted on various apparatuses (for example, Patent Document 1 (JP-A-2013-125907)).

As disclosed in Patent Document 1, for example, the atomic oscillator using the quantum interference effect includes a gas cell in which a gaseous alkali metal is enclosed, a light source that outputs resonance light for resonance of the alkali metal in the gas cell, and a photodetector (light receiving unit) that detects the resonance light transmitted through the gas cell. Further, in the atomic oscillator, an electromagnetically induced transparency (EIT) phenomenon that, when the frequency difference between two kinds of resonance lights takes a specific value, none of the two kinds of resonance lights are absorbed by the alkali metal within the gas cell, but transmitted occurs, and an EIT signal as a steep signal generated with the EIT phenomenon is detected by the photodetector and the EIT signal is used as a reference signal.

However, in the atomic oscillator of Patent Document 1, a surface-emitting laser (VCSEL) that outputs lights in a single mode is used as the light source for resonation of the alkali metal. Accordingly, compared to a multimode surface-emitting laser that outputs lights in a plurality of modes, there are problems in structure that the drive voltage is higher, the resistance to electrostatic discharge damage is lower, and the life is shorter.

SUMMARY

An advantage of some aspects of the invention is to solve at least a part of the problems described above, and the invention can be implemented as the following forms or application examples.

Application Example 1

A quantum interference device according to this application example includes a coherent light source, a unit that superimposes microwave on the coherent light source to generate a side band, an atom cell in which an alkali metal gas is enclosed, and a light receiving unit that detects light transmitted through the atom cell, wherein the coherent light source is a surface-emitting laser that outputs a zero-order mode light and a plurality of higher-order mode lights, and a mode filter that cuts the higher-order mode lights is placed between the coherent light source and the atom cell.

According to this application example, the mode filter that cuts the higher-order mode lights is placed between the coherent light source and the atom cell, and thereby, in the lights in the higher-order modes including the zero-order mode output from the surface-emitting laser that outputs the plurality of lights, the higher-order mode lights having the larger mode radiuses than the mode radius in the zero-order mode can be cut or attenuated by the mode filter. Accordingly, degradation of the S/N-ratio of the EIT signal caused by the entry of the unnecessary higher-order mode lights not caused by the resonance of the alkali metal into the light receiving unit can be reduced. Therefore, the surface-emitting laser (multimode surface-emitting laser) that outputs a plurality of lights can be used, and the quantum interference device having the lower drive voltage, the higher resistance to electrostatic discharge damage, and the longer life can be provided.

Application Example 2

In the quantum interference device according to the application example, it is preferable that the mode filter is a light shielding plate having a pinhole on an optical axis of the coherent light source.

According to this application example, the mode filter is the light shielding plate having the pinhole on the optical axis of the coherent light source, and thereby, in the lights in the higher-order modes including the zero-order mode output from the multimode surface-emitting laser, only the zero-order mode light having the smaller mode radius passes through the pinhole of the mode filter and contributes to the resonance of the alkali metal. Further, the higher-order mode lights in the first and higher-order modes having the larger mode radiuses than that in the zero-order mode can be cut or attenuated by a light shielding region formed around the pinhole of the mode filter. Accordingly, the entry of the unnecessary higher-order mode lights into the light receiving unit can be reduced and the degradation of the S/N-ratio of the EIT signal can be reduced.

Application Example 3

In the quantum interference device according to the application example, it is preferable that the light shielding plate has a light shielding region with a metal formed therein.

According to this application example, the metal is formed in the light shielding region of the mode filter, and thereby, the higher-order mode lights in the first and higher-order modes having the larger mode radiuses than that in the zero-order mode can be reflected and the entry of the unnecessary higher-order mode lights into the light receiving unit can be reduced and the degradation of the S/N-ratio of the EIT signal can be reduced.

Application Example 4

In the quantum interference device according to the application example, it is preferable that the light shielding plate has a light shielding region with a light absorbing member formed therein.

According to this application example, the light absorbing member is formed in the light shielding region of the mode filter, and thereby, the higher-order mode lights in the first and higher-order modes having the larger mode radiuses than that in the zero-order mode can be absorbed by the light absorbing member and the entry of the unnecessary higher-order mode lights into the light receiving unit can be reduced and the degradation of the S/N-ratio of the EIT signal can be reduced.

Application Example 5

In the quantum interference device according to the application example, it is preferable to provide a λ/4-wave plate placed between the coherent light source and the atom cell and circularly-polarizing the light output from the coherent light source.

According to this application example, the λ/4-wave plate is placed between the coherent light source and the atom cell, and thereby, the light output from the coherent light source can be converted from linearly-polarized light into circularly-polarized light and the intensity of the EIT signal can be improved.

Application Example 6

In the quantum interference device according to the application example, it is preferable to provide a neutral density filter placed between the coherent light source and the atom cell and adjusting intensity of the light output from the coherent light source.

According to this application example, the neutral density filter is placed between the coherent light source and the atom cell, and thereby, the intensity of the light output from the coherent light source can be adjusted and the intensity of the EIT signal can be adjusted.

Application Example 7

An atomic oscillator according to this application example includes the quantum interference device according to the application example.

According to this application example, the atomic oscillator including the quantum interference device having the longer life and the superior reliability can be provided.

Application Example 8

An electronic apparatus according to this application example includes the quantum interference device according to the described application example.

According to this application example, the electronic apparatus including the quantum interference device having the longer life and the superior reliability can be provided.

Application Example 9

A moving object according to this application example includes the quantum interference device according to the described application example.

According to this application example, the moving object including the quantum interference device having the longer life and the superior reliability can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

As below, a quantum interference device, an atomic oscillator, an electronic apparatus, and a moving object according to the invention will be explained in detail with reference to embodiments shown in the accompanying drawings.

1. Atomic Oscillator (Quantum Interference Device)

First, the atomic oscillator according to the invention (the atomic oscillator including the quantum interference device according to the invention) will be explained. Note that an example in which the quantum interference device according to the invention is applied to the atomic oscillator will be explained as below, however, the quantum interference device according to the invention can be applied to a device such as a magnetic sensor or a quantum memory, not limited to that.

First Embodiment

First, the atomic oscillator (quantum interference device) according to the first embodiment of the invention will be explained with reference to FIGS. 1 to 3.

Figure 1:
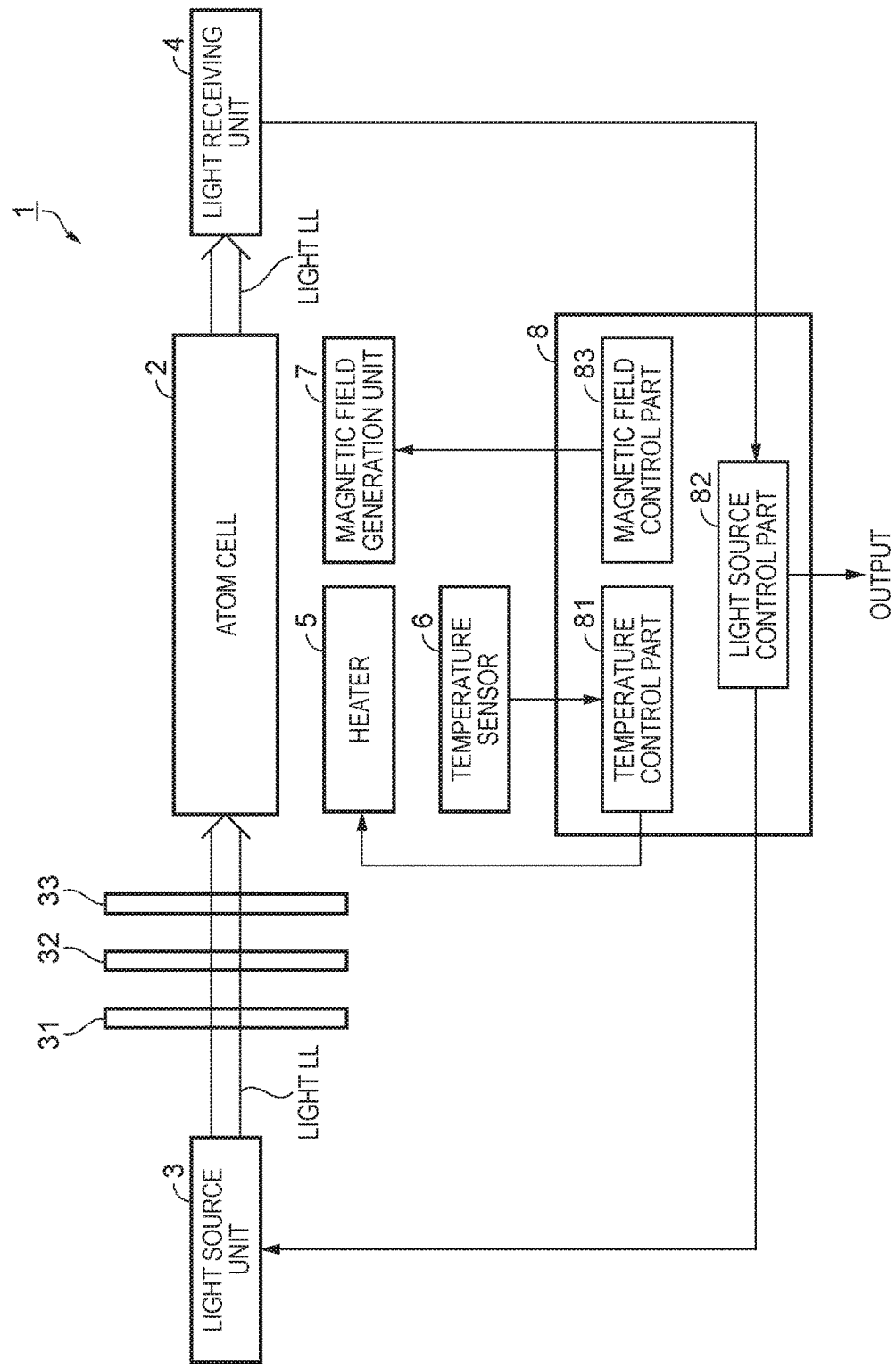
FIG. 1 is a schematic view showing an atomic oscillator (quantum interference device) according to a first embodiment of the invention.
Figure 2:
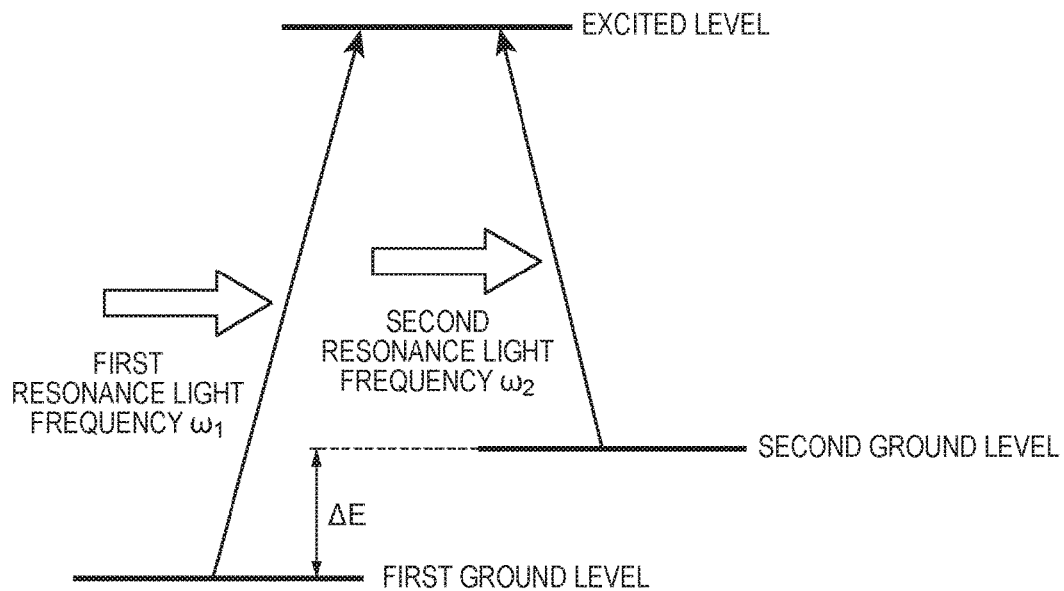
FIG. 2 is a diagram for brief explanation of energy states of an alkali metal atom.

FIG. 1 is a schematic view showing the atomic oscillator (quantum interference device) according to the embodiment. FIG. 2 is a diagram for brief explanation of energy states of an alkali metal atom. FIG. 3 is a graph showing a relationship between a frequency difference between two lights output from a light source unit and light intensity detected in a light receiving unit.

An atomic oscillator 1 shown in FIG. 1 is an atomic oscillator utilizing the quantum interference effect. As shown in FIG. 1, the atomic oscillator 1 includes an atom cell (gas cell) 2, a light source unit 3 as a coherent light source, a mode filter 31, optical components 32, 33, a light receiving unit 4 as light detecting means, a heater 5, a temperature sensor 6, a magnetic field generation unit 7, and a control unit 8.

First, the principle of the atomic oscillator 1 will be briefly explained.

As shown in FIG. 1, in the atomic oscillator 1, the light source unit 3 outputs light LL toward the atom cell 2 and the light receiving unit 4 detects the light LL transmitted through the atom cell 2.

Within the atom cell 2, a gaseous alkali metal (metal atoms) is enclosed. As shown in FIG. 2, the alkali metal has energy levels of a three-level system including two ground levels (first ground level and second ground level) and an excited level. Here, the first ground level refers to an energy state lower than the second ground level.

The light source unit 3 outputs the light LL that resonates the alkali metal within the atom cell 2. Microwave is superimposed on the light LL output from the light source unit 3 as means for generating a side band, and the light includes two kinds of first resonance light and second resonance light having different wavelengths. When the first resonance light and the second resonance light are applied to the above described gaseous alkali metal, light absorptance (light transmittance) of the first resonance light and the second resonance light in the alkali metal changes according to a difference ($\omega_1-\omega_2$) between the frequency $\omega_1$ of the first resonance light and the frequency $\omega_2$ of the second resonance light.

When the difference ($\omega_1-\omega_2$) between the frequency of the first resonance light and the frequency $\omega_2$ of the second resonance light coincides with the frequency corresponding to an energy difference $\Delta E$ between the first ground level and the second ground level, excitation from the first ground level and the second ground level to the excited level is respectively stopped. In this regard, both the first resonance light and the second resonance light are transmitted, not absorbed by the alkali metal. The phenomenon is called a CPT phenomenon or electromagnetically induced transparency phenomenon (EIT).

Figure 3:
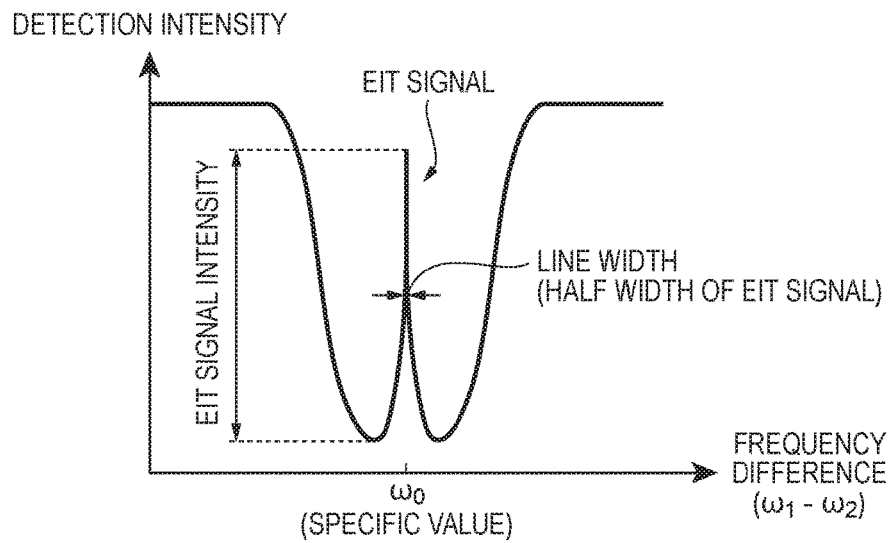
FIG. 3 is a graph showing a relationship between a frequency difference between two lights output from a light source unit and light intensity detected in a light receiving unit.

For example, in the case where the light source unit 3 fixes the frequency $\omega_1$ of the first resonance light and changes the frequency $\omega_2$ of the second resonance light, when the difference ($\omega_1-\omega_2$) between the frequency $\omega_1$ of the first resonance light and the frequency $\omega_2$ of the second resonance light coincides with the frequency $\omega_0$ corresponding to the energy difference $\Delta E$ between the first ground level and the second ground level, the detection intensity of the light receiving unit 4 steeply increases as shown in FIG. 3. The steep signal is detected as an EIT signal. The EIT signal has an eigenvalue determined depending on the kind of alkali metal. Therefore, a high-accuracy oscillator may be formed using the EIT signal as a reference.

As below, the respective parts of the atomic oscillator 1 will be sequentially explained in detail.

Gas Cell

A gaseous alkali metal such as rubidium, cesium, or sodium is enclosed within the atom cell 2. Further, as appropriate, a rare gas such as argon or neon or an inert gas such as nitride may be enclosed with the alkali metal gas as a buffer gas within the atom cell 2.

Light Source

The light source unit 3 as the coherent light source has a function of outputting light LL including the above described first resonance light and second resonance light that form a resonance light pair that resonates the alkali metal within the atom cell 2.

Further, the light LL output by the light source unit 3 includes the first resonance light and second resonance light generated by superimposition of microwave. Note that the first resonance light is light (probe light) that excites the alkali metal within the atom cell 2 from the above described first ground level to excited level. On the other hand, the second resonance light is light (coupling light) that excites the alkali metal within the atom cell 2 from the above described second ground level to excited level.

The light source unit 3 is a surface-emitting laser (VCSEL) that outputs a zero-order mode light and a plurality of higher-order lights (hereinafter, referred to as multimode surface-emitting laser"). The multimode surface-emitting laser has advantages in structure that the drive voltage is lower, the resistance to electrostatic discharge damage is higher, and the life is longer than a single-mode surface-emitting laser that outputs single-mode lights. However, unnecessary mode lights not caused by the resonation of the alkali metal are also output and transmitted through the atom cell 2 and enter the light receiving unit 4, and there are problems that noise components are generated and the S/N-ratio of the EIT signal as an index of frequency stability is degraded. To avoid the problems, in the embodiment, the mode filter 31 is placed between the light source unit 3 and the atom cell 2.

Mode Filter

The mode filter 31 has a function of cutting the higher-order modes of the light LL output from the light source unit 3.

Figure 4:
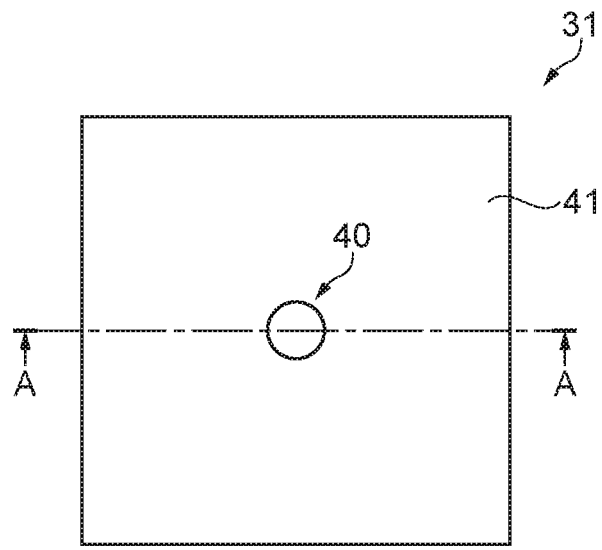
FIG. 4 is a plan view of a mode filter.
Figure 5:
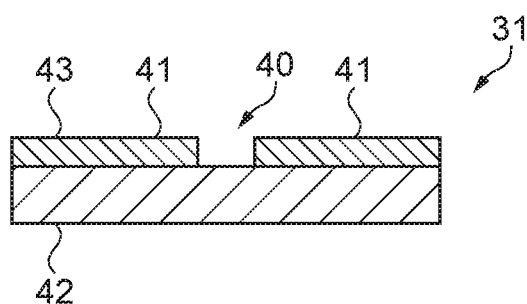
FIG. 5 is a sectional view along line A-A in FIG. 4.

FIG. 4 is a plan view of the mode filter, and FIG. 5 is a sectional view along line A-A in FIG. 4.

The mode filter 31 is a light shielding plate and placed between the light source unit 3 and the atom cell 2. As shown in FIGS. 4 and 5, the mode filter 31 is formed using a transparent member 42 of glass or the like and a metal 43 such as aluminum or copper as a light shielding member, and has a pinhole as an opening portion 40 of the metal 43 in the center part. In other words, the metal 43 as the light shielding member is formed in a light shielding region 41 except the opening portion 40. The opening portion 40 of the mode filter 31 is provided on the optical axis of the light LL output from the light source unit 3, and the light LL entering the opening portion 40 passes. Note that it is preferable that the shape of the opening portion 40 is a circular shape.

Here, a method of cutting or attenuating the unnecessary higher-order modes of the light LL output from the light source unit 3 as the multimode surface-emitting laser (VCSEL) will be explained with reference to FIGS. 6 to 9.

Figure 6:
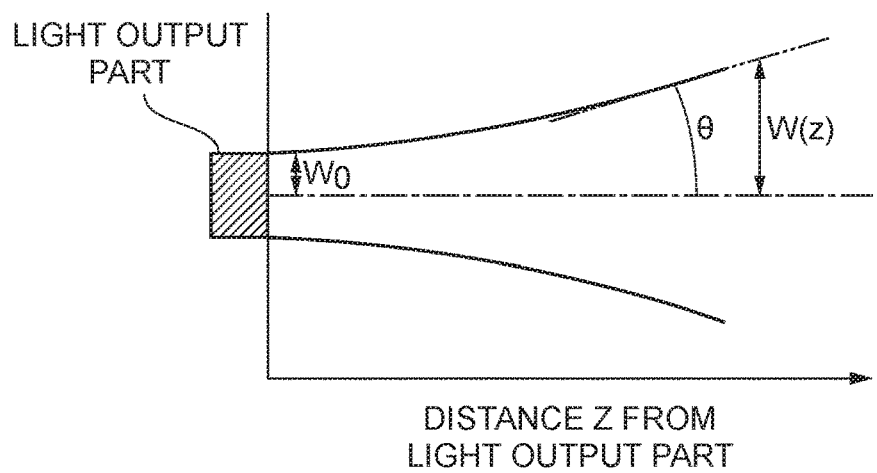
FIG. 6 is a diagram for explanation of a relationship between a beam radius and a radiation angle of a Gaussian beam.
Figure 7:
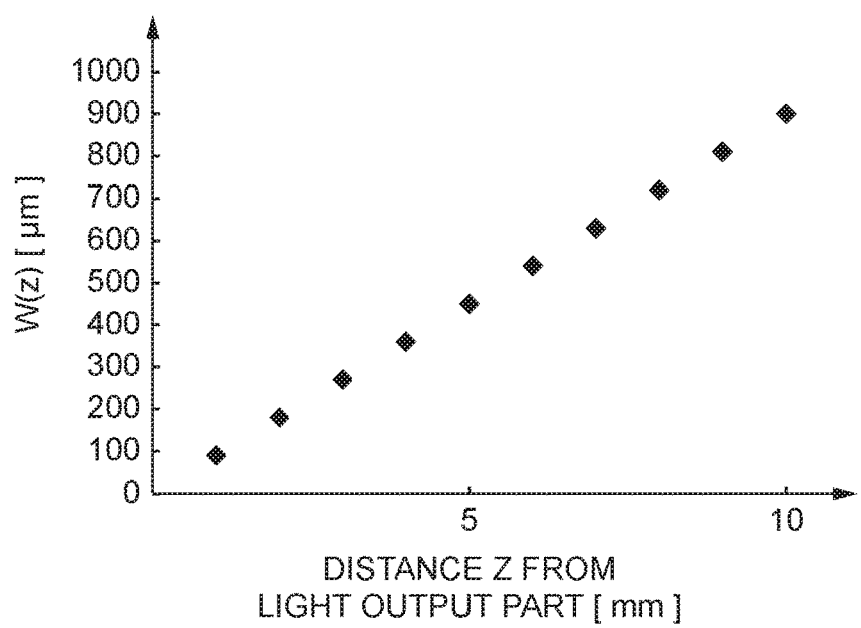
FIG. 7 is a graph showing a relationship between a beam radius of a Gaussian beam and a distance from a light output part.
Figure 8:
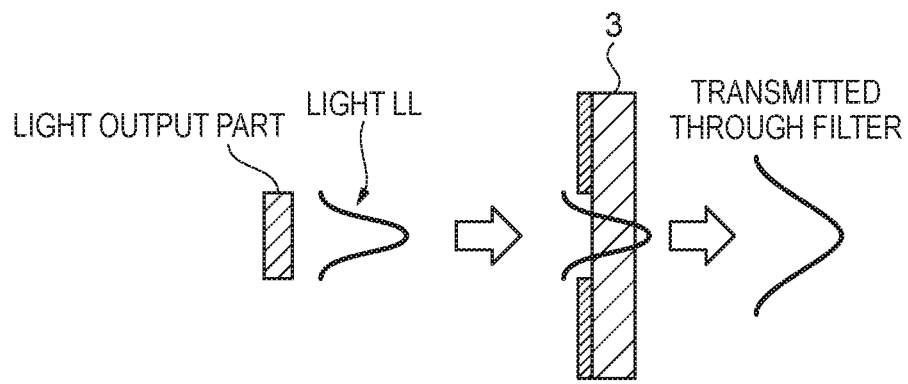
FIG. 8 is a diagram for explanation of a zero-order mode Gaussian beam that passes through the mode filter.
Figure 9:
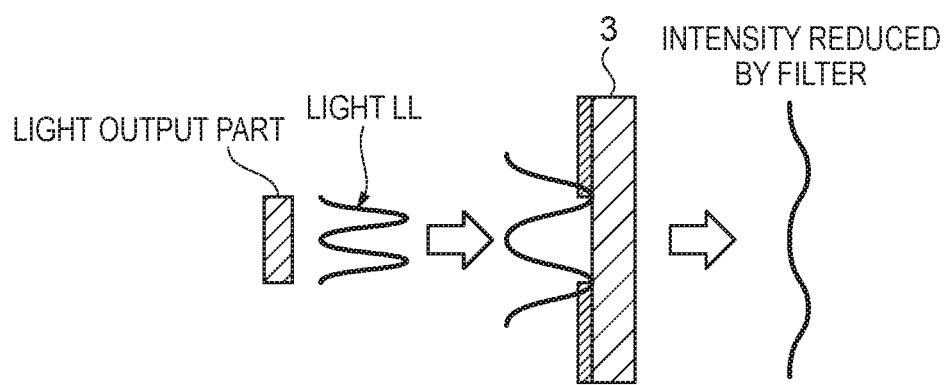
FIG. 9 is a diagram for explanation of a first-order mode Gaussian beam that passes through the mode filter.

FIG. 6 is a diagram for explanation of a relationship between a beam radius W and a radiation angle θ of a Gaussian beam. FIG. 7 is a graph showing a relationship between a beam radius W(z) of a zero-order mode Gaussian beam and a distance z from a light output part. FIG. 8 is a diagram for explanation of a zero-order mode Gaussian beam that passes through the mode filter. FIG. 9 is a diagram for explanation of a first-order mode Gaussian beam that passes through the mode filter.

The fundamental mode beam output from the multimode surface-emitting laser may be handled as a zero-order mode Gaussian beam. Note that the Gaussian beam refers to electromagnetic wave having electric field and intensity (irradiance) distributions in the transverse mode may be approximately regarded as Gaussian distributions.

As shown in FIG. 6, the beam radius W of the Gaussian beam output from the light output part of the multimode surface-emitting laser tends to be larger as the distance is larger from the output part. This can be calculated using the following expression. Note that the beam radius W refers to the radius of the beam.

$$W(z) = \frac{\lambda \cdot z}{\pi \cdot W_0}$$

Here, W(z) is a beam radius at a distance z from the light output part, λ is a wavelength, z is a distance from the light output part, and $W_0$ is a beam radius in the light output part (z=0).

FIG. 7 shows calculation results of the beam radius W(z) of the Gaussian beam with respect to the distance z from the light output part using the above expression. As the distance z from the light output part is larger, the beam radius W(z) of the Gaussian beam is larger. That is, let the beam radius $W_0$ in the light output part be about 3 μm, when the distance z from the light output part is 1 mm, the beam radius W(z) is about 90 μm. Note that, as the distance z from the light output part is larger, the beam radius W(z) is larger as is the case with the plurality of higher-order modes including the first-order mode and the second-order mode output from the multimode surface-emitting laser, not the zero-order mode.

Further, regarding the lights LL in the zero-order mode and the plurality of higher-order modes including the first-order mode and the second-order mode output from the multimode surface-emitting laser, the light two-dimensionally spreads and the beam radius W(z) is larger as the order of the modes of the electric field and intensity (irradiance) distributions is higher.

Accordingly, in the embodiment, a method of cutting unnecessary higher-order modes by placing the mode filter 31 having the pinhole opening portion 40 between the light source unit 3 and the atom cell 2 and passing only the zero-order mode in the smaller beam radius W has been conceived because the beam radius W of the Gaussian beam output from the multimode surface-emitting laser is larger as the distance is larger from the light output part and the order of the mode is higher.

As shown in FIG. 8, it is possible that the zero-order mode Gaussian beam as the light LL output from the multimode surface-emitting laser passes through the opening portion 40 of the mode filter 31 because the beam radius W is smaller than the opening radius of the opening portion 40 of the mode filter 31 near the mode filter 31. On the other hand, as shown in FIG. 9, it is nearly impossible that the first-order mode Gaussian beam passes through the opening portion 40 of the mode filter 31 because the beam radius W is larger than the opening radius of the opening portion 40 of the mode filter 31 near the light output part.

If the first-order mode Gaussian beam passes through the opening portion 40 of the mode filter 31, the electric field and intensity (irradiance) distributions are lower, and, if the beam is transmitted through the atom cell 2 and enters the light receiving unit 4, generation of noise components and degradation of the S/N-ratio of the EIT signal as an index of frequency stability may be reduced. Regarding the higher-order mode Gaussian beams having the larger beam radiuses W than the beam radius W of the first-order mode Gaussian beam, their electric field and intensity (irradiance) distributions may be made sufficiently lower by the mode filter 31 and the S/N-ratio degradation of the EIT signal may be sufficiently reduced.

Therefore, the opening radius dimension of the opening portion 40 of the mode filter 31 and the distance z from the light output part of the light source unit 3 to the mode filter 31 are optimized, and thereby, only the zero-order mode Gaussian beam caused by generation of the EIT signal may be passed and the entry of the first-order mode and higher-order mode Gaussian beams into the light receiving unit 4 that causes degradation of the S/N-ratio of the EIT signal may be sufficiently reduced.

Optical Components

The optical component 32 is a λ/4-wave plate and placed between the light source unit 3 and the atom cell 2. Thereby, the light LL output from the light source unit 3 and passing through the mode filter 31 may be converted from linearly-polarized light into circularly-polarized light (right circularly-polarized light or left circularly-polarized light). The light LL is converted from linearly-polarized light into circularly-polarized light, and thereby, the intensity of the EIT signal may be improved. Note that "circularly-polarized light" refers to light, when attention is focused on vibration of either the electric field component or the magnetic field component of light wave, having a vibration direction rotating at a frequency of the light wave within a plane orthogonal to the traveling direction of the light and a constant amplitude regardless of the direction, in other words, having the vibration of the electric field (or the magnetic field) describing a circle with propagation.

The optical component 33 is a neutral density filter (ND filter) and placed between the light source unit 3 and the atom cell 2. Thereby, the intensity of the light LL entering the atom cell 2 may be adjusted (reduced). Accordingly, even when the output of the light source unit 3 is larger, the amount of the light LL entering the atom cell 2 may be set to a desired amount. Note that the placement position of the optical component 33 may be between the light source unit 3 and the mode filter 31 or between the optical component 32 and the atom cell 2.

Light Receiving Unit

The light receiving unit 4 as the light detecting means has a function of detecting the intensity of the light LL (particularly, the resonance light pair including the first resonance light and the second resonance light) transmitted through the atom cell 2.

The light receiving unit 4 is not particularly limited as long as it may detect the intensity of the above described light LL. For example, a photodetector (light receiving element) including a photodiode that outputs a signal according to the received light intensity may be employed.

Heater

The heater 5 (heating unit) has a function of heating the above described atom cell 2 (more specifically, the alkali metal in the atom cell 2). Thereby, the alkali metal in the atom cell 2 may be maintained in the gaseous state at an appropriate concentration.

The heater 5 includes e.g. a heating resistor that generates heat by energization. The heating resistor may be provided in contact with the atom cell 2 or in no contact with the atom cell 2.

When the heating resistor is provided in no contact with the atom cell 2, heat may be transferred from the heating resistor to the atom cell 2 via a member of metal, ceramics, or the like with superior thermal conductivity.

Note that the heater 5 is not limited to the above described form as long as it may heat the atom cell 2, but various kinds of heaters may be employed. Or, the atom cell 2 may be temperature-controlled using a Peltier element in place of the heater 5, or with the heater 5.

Temperature Sensor

The temperature sensor 6 has a function of detecting the temperature of the heater 5 or the atom cell 2. For example, the temperature sensor 6 is placed in contact with the heater 5 or the atom cell 2.

The temperature sensor 6 is not particularly limited, but various kinds of known temperature sensors including a thermistor and a thermocouple may be employed.

Magnetic Field Generation Unit

The magnetic field generation unit 7 has a function of applying a magnetic field to the alkali metal within the atom cell 2. Thereby, by Zeeman splitting, gaps between the different degenerated energy levels of the alkali metal atoms within the atom cell 2 may be expanded and resolution may be improved. As a result, the precision of the oscillation frequency of the atomic oscillator 1 may be improved.

The magnetic field generation unit 7 may include e.g. a coil wound along the outer circumference of the atom cell 2 to form a solenoid type or a pair of coils provided to be opposed via the atom cell 2 to form a Helmholtz type.

Further, the magnetic field generated by the magnetic field generation unit 7 is a constant magnetic field (direct-current magnetic field), however, an alternating-current magnetic field may be superimposed thereon.

Control Unit

The control unit 8 has a function of respectively controlling the light source unit 3, the heater 5, and the magnetic field generation unit 7, and a function of superimposing microwave on the light LL output from the light source unit 3 as means for generating the side band.

The control unit 8 has a light source control part 82 that controls the light source unit 3, a temperature control part 81 that controls the temperature of the alkali metal in the atom cell 2, and a magnetic field control part 83 that controls the magnetic field from the magnetic field generation unit 7.

The light source control part 82 has a function of controlling the frequencies of the first resonance light and the second resonance light output from the light source unit 3 based on the detection result of the above described light receiving unit 4. More specifically, the light source control part 82 controls the frequencies of the first resonance light and the second resonance light output from the light source unit 3 so that the above described frequency difference $(\omega_1-\omega_2)$ may be the above described frequency $\omega_0$ unique to the alkali metal.

Next, the light source control part 82 within the control unit 8 will be explained in detail with reference to FIG. 10.

Figure 10:
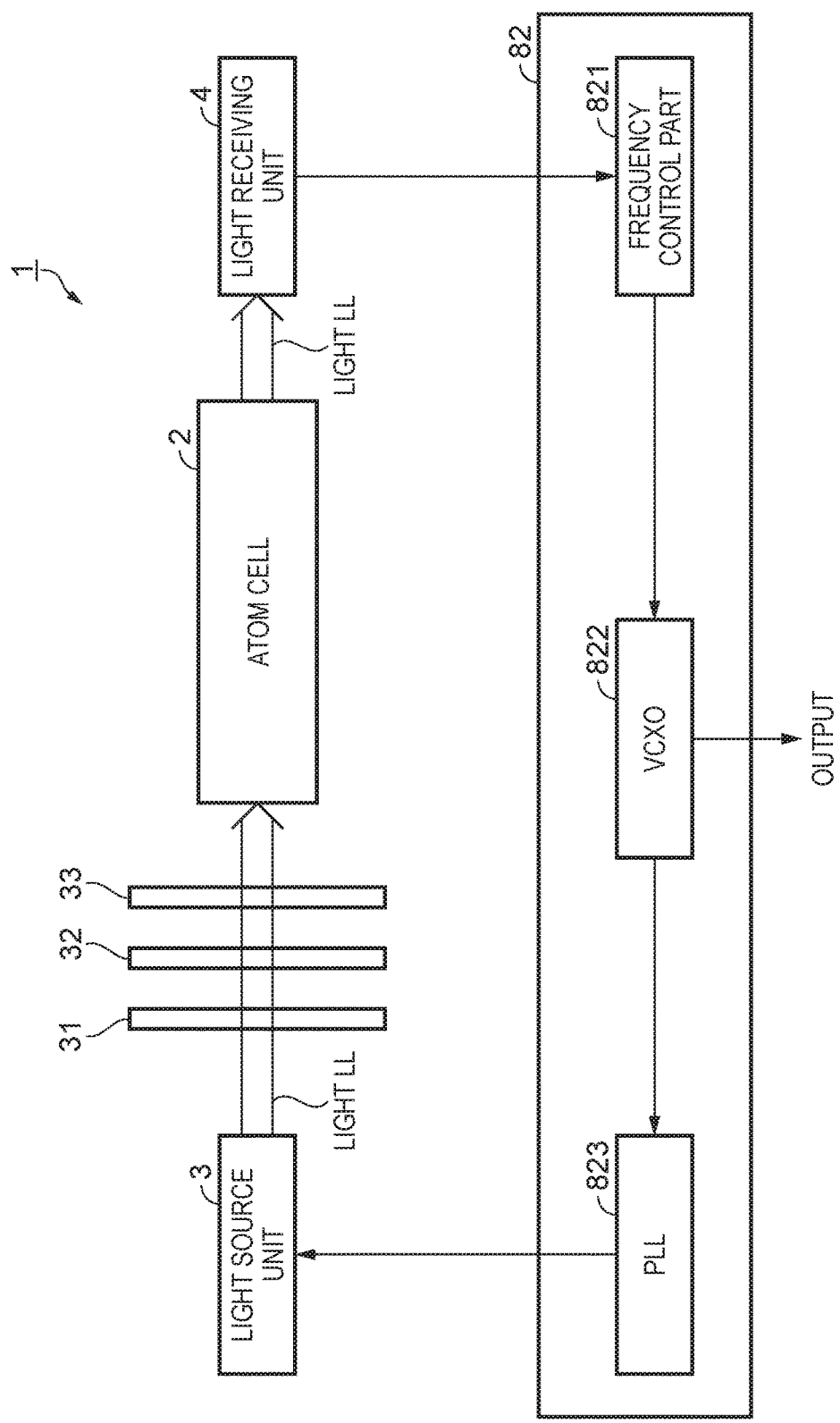
FIG. 10 is a schematic diagram for explanation of a light source control part provided in the atomic oscillator shown in FIG. 1.

FIG. 10 is a schematic diagram for explanation of the light source control part provided in the atomic oscillator shown in FIG. 1.

The light source control part 82 includes a frequency control part 821, a voltage-controlled crystal oscillator 822 (VCXO), and a phase locked loop 823 (PLL).

The frequency control part 821 detects the EIT status within the atom cell 2 based on the light reception intensity of the light receiving unit 4, and outputs a control voltage according to the detection result. Thereby, the frequency control part 821 controls the voltage-controlled crystal oscillator 822 so that the EIT signal may be detected by the light receiving unit 4.

The voltage-controlled crystal oscillator 822 is controlled to be at a desired oscillation frequency by the frequency control part 821, and oscillates at a frequency of about several megahertz to several tens of megahertz, for example.

Further, the output signal of the voltage-controlled crystal oscillator 822 is input to the phase locked loop 823 and output as an output signal of the atomic oscillator 1.

The phase locked loop 823 frequency-multiplies the output signal from the voltage-controlled crystal oscillator 822. Thereby, the phase locked loop 823 oscillates at a half frequency of the frequency corresponding to the energy difference $\Delta E$ between the above described two different ground levels of the alkali metal. A direct-current bias current is superimposed on the multiplied signal (high-frequency signal) and the signal is input to the light source unit 3 as a drive signal. Here, the current value of the direct-current bias current is controlled to be a predetermined value by a bias control part (not shown). Thereby, the center frequencies of the first resonance light and the second resonance light may be desirably controlled.

Note that the light source unit 3 is temperature-controlled to a predetermined temperature by a temperature control element (not shown, a heating resistor, Peltier element, or the like). Accordingly, the center frequencies of the first resonance light and the second resonance light may be controlled by the adjustment of the temperature of the light source unit 3.

The temperature control part 81 controls energization to the heater 5 based on the detection result of the temperature sensor 6. Thereby, the atom cell 2 may be maintained within a desired temperature range. For example, the atom cell 2 is temperature-controlled to e.g. about 70° C. by the heater 5.

The magnetic field control part 83 controls energization to the magnetic field generation unit 7 so that the magnetic field generated by the magnetic field generation unit 7 may be constant.

The control unit 8 is provided on e.g. an IC chip mounted on a substrate.

As above, the configuration of the atomic oscillator 1 is briefly explained.

Note that the above described configuration can be applied as a quantum interference device, and a section including at least the gaseous alkali metal, the light source unit 3 for generating the resonance light pair at different frequencies holding the frequency difference corresponding to energy difference $\Delta E$ between the two ground states of the alkali metal, the light receiving unit 4 that detects the resonance lights, and the atom cell 2 that encloses the alkali metal and including a part that produces the electromagnetically induced transmission phenomenon by interaction of the alkali metal and the resonance light pair is referred to as the quantum interference device.

As described above, in the atomic oscillator 1, the mode filter 31 that cuts the higher-order modes is placed between the light source unit 3 as the coherent light source and the atom cell 2, and thereby, in the lights LL in the higher-order modes including the zero-order mode output from the multimode surface-emitting laser, the higher-order mode lights having the larger mode radiuses W than the mode radius W in the zero-order mode may be cut or attenuated by the mode filter 31. Accordingly, the degradation of the S/N-ratio of the EIT signal caused by the entry of the unnecessary higher-order mode lights not caused by the resonance of the alkali metal into the light receiving unit 4 may be reduced. Therefore, the multimode surface-emitting laser (the surface-emitting laser that outputs a zero-order mode light and a plurality of higher-order mode lights) may be used, and the quantum interference device having the lower drive voltage, the higher resistance to electrostatic discharge damage, and the longer life may be provided.

The mode filter 31 is the light shielding plate having the opening portion 40 as the pinhole on the optical axis of the light source unit 3, and thereby, in the lights LL in the higher-order modes including the zero-order mode output from the light source unit 3, only the zero-order mode light having the smaller mode radius W passes through the opening portion 40 of the mode filter 31 and contributes to the resonance of the alkali metal. Further, the higher-order mode lights LL in the first and higher-order modes having the larger mode radiuses W than that in the zero-order mode may be cut or attenuated by the light shielding region 41 formed around the opening portion 40 of the mode filter 31. Accordingly, the entry of the unnecessary higher-order mode lights into the light receiving unit 4 may be reduced and the degradation of the S/N-ratio of the EIT signal may be reduced.

The metal 43 is formed in the light shielding region 41 of the mode filter 31, and thereby, the higher-order mode lights LL in the first and higher-order modes having the larger mode radiuses W than that in the zero-order mode may be reflected and the entry of the unnecessary higher-order mode lights into the light receiving unit 4 may be reduced and the degradation of the S/N-ratio of the EIT signal may be reduced.

The $\lambda/4$-wave plate (optical component 32) is placed between the light source unit 3 and the atom cell 2, and thereby, the light LL output from the light source unit 3 may be converted from linearly-polarized light into circularly-polarized light and the intensity of the EIT signal may be improved.

Further, the neutral density filter (optical component 33) is placed between the light source unit 3 and the atom cell 2, and thereby, the intensity of the light LL output from the light source unit 3 may be adjusted and the intensity of the EIT signal may be adjusted.

Note that the invention is not limited to the above described embodiment, but various changes and improvements can be made to the above described embodiment. As below, the second embodiment will be described.

Second Embodiment

Next, the second embodiment of the invention will be explained with reference to FIGS. 11 and 12.

Figure 11:
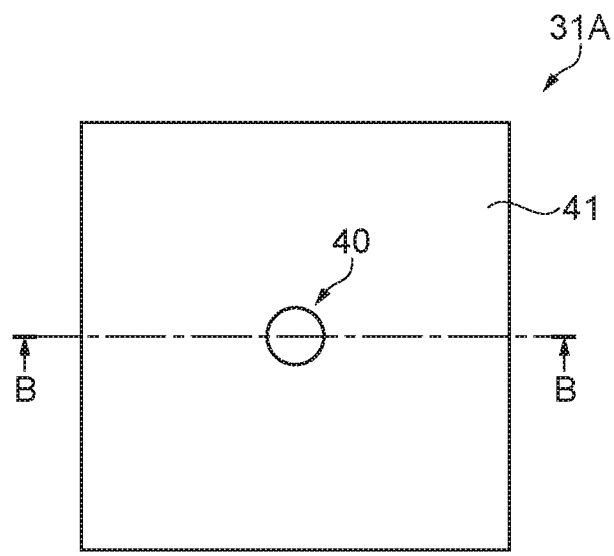
FIG. 11 is a plan view of a mode filter used for an atomic oscillator (quantum interference device) according to a second embodiment of the invention.

FIG. 11 is a plan view of a mode filter used for an atomic oscillator (quantum interference device) according to the second embodiment of the invention. FIG. 12 is a sectional view along line B-B in FIG. 11.

The embodiment is the same as the above described first embodiment except the difference in the configuration of a mode filter 31A.

Note that, in the following explanation, the second embodiment will be explained with a focus on the difference from the above described embodiment, and the explanation of the same items will be omitted. Further, in FIGS. 11 and 12, the same configurations as those of the above described embodiment have the same signs.

Figure 12:
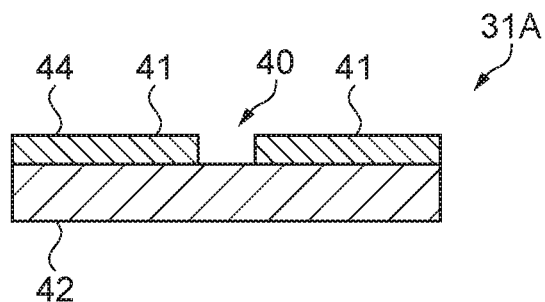
FIG. 12 is a sectional view along line B-B in FIG. 11.

As shown in FIGS. 11 and 12, the mode filter 31A includes a transparent member 42 of glass or the like and a light absorbing member 44 as a light shielding member, and has a pinhole as an opening portion 40 of the light absorbing member 44 in the center part. In other words, the light absorbing member 44 is formed in a light shielding region 41 except the opening portion 40.

Note that, as the material of the light absorbing member 44, a resin material including polycarbonate containing a pigment such as a cyanine pigment, a phthalocyanine pigment, and an azo compound, epoxy resin, and vinyl chloride is preferable.

According to the configuration, the light absorbing member 44 is formed in the light shielding region 41 of the mode filter 31A, and thereby, in the lights LL in the higher-order modes including the zero-order mode output from the light source unit 3, the higher-order mode lights LL having the larger mode radiuses W than that in the zero-order mode may be absorbed by the light absorbing member 44. Accordingly, the entry of the unnecessary higher-order mode lights into the light receiving unit 4 may be reduced, and the degradation of the S/N-ratio of the EIT signal may be reduced.

2. Electronic Apparatus

The above described atomic oscillators may be incorporated into various kinds of electronic apparatuses.

As below, an electronic apparatus according to the invention will be explained.

Figure 13:
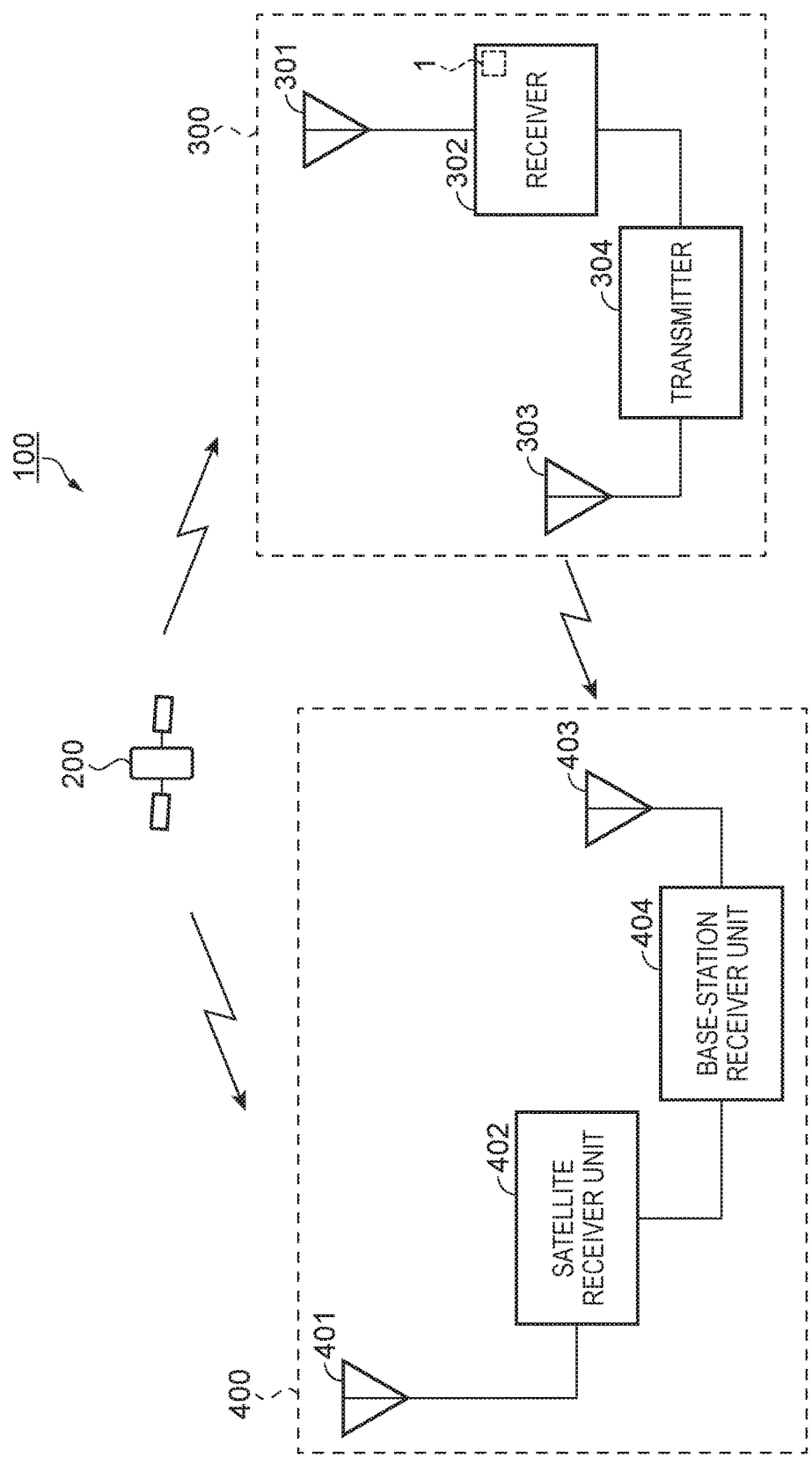
FIG. 13 shows a schematic configuration when the atomic oscillator according to the invention is used for a positioning system utilizing a GPS satellite.

FIG. 13 shows a schematic configuration when the atomic oscillator according to the invention is used for a positioning system utilizing a GPS satellite.

A positioning system 100 shown in FIG. 13 includes a GPS satellite 200, a base station apparatus 300, and a GPS receiving apparatus 400.

The GPS satellite 200 transmits positioning information (GPS signals).

The base station apparatus 300 includes a receiver 302 that precisely receives the positioning information from the GPS satellite 200 via an antenna 301 installed in an electronic reference point (GPS continuous observation station), and a transmitter 304 that transmits the positioning information received by the receiver 302 via an antenna 303.

Here, the receiver 302 is an electronic device including the above described atomic oscillator according to the invention as a reference frequency oscillation source thereof. The receiver 302 has superior reliability. Further, the positioning information received by the receiver 302 is transmitted by the transmitter 304 in real time.

The GPS receiving apparatus 400 includes a satellite receiver unit 402 that receives the positioning information from the GPS satellite 200 via an antenna 401 and a base-station receiver unit 404 that receives the positioning information from the base station apparatus 300 via an antenna 403.

Note that the electronic apparatus according to the invention is not limited to the above described apparatus, but may be applied to e.g. a cell phone, a digital still camera, an inkjet ejection device (e.g. an inkjet printer), a personal computer (mobile personal computer, laptop personal computer), a television, a video camera, a video tape recorder, a car navigation system, a pager, a personal digital assistance (with or without communication function), an electronic dictionary, a calculator, an electronic game machine, a word processor, a work station, a videophone, a security television monitor, electronic binoculars, a POS terminal, a medical device (e.g. an electronic thermometer, a sphygmomanometer, a blood glucose meter, an electrocardiographic measurement system, an ultrasonic diagnostic system, or an electronic endoscope), a fish finder, various measuring instruments, meters and gauges (for example, meters for vehicles, airplanes, and ships), a flight simulator, digital terrestrial broadcasting, a cell phone base station, a GPS module, or the like.

3. Moving Object

Figure 14:
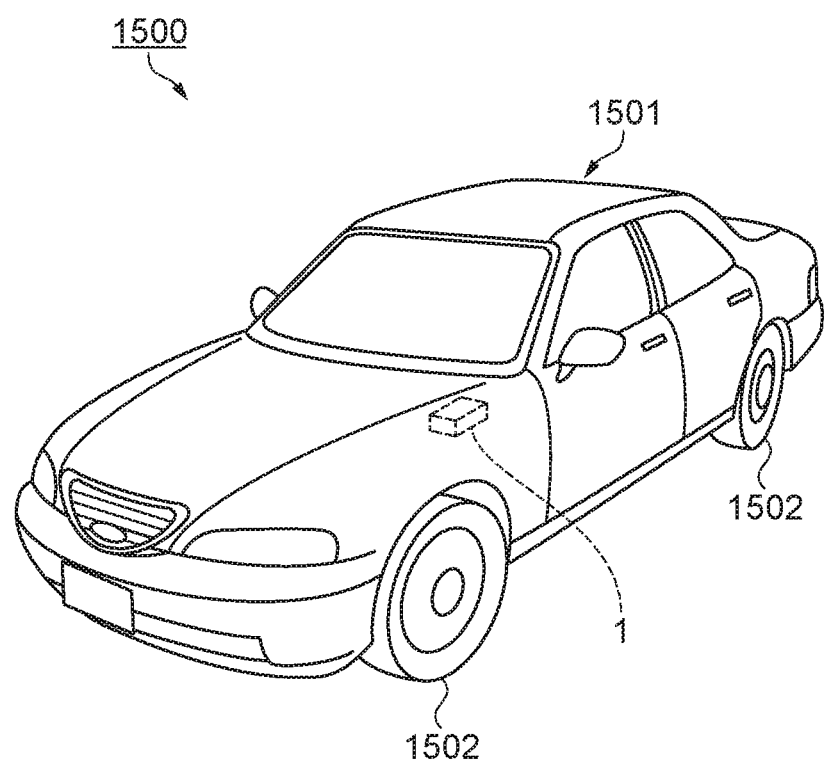
FIG. 14 shows an example of a moving object according to the invention.

FIG. 14 shows an example of a moving object according to the invention.

In the drawing, an automobile 1500 as the moving object includes a vehicle body 1501 and a four wheels 1502, and is adapted to turn the wheels 1502 by a power source (engine) (not shown) provided in the vehicle body 1501. The automobile 1500 contains the atomic oscillator 1.

The quantum interference device, the atomic oscillator, the electronic apparatus, and the moving object are explained based on the illustrated embodiments, however, the invention is not limited to those.

Further, the configurations of the respective parts of the invention may be replaced by arbitrary configurations that exhibit the same functions as those of the above described embodiments, or arbitrary configurations may be added thereto. Furthermore, in the invention, arbitrary configurations of the above described respective embodiments may be combined.

The entire disclosure of Japanese Patent Application No. 2016-032756, filed Feb. 24, 2016 is expressly incorporated by reference herein.

What is claimed is:

1. A quantum interference device comprising:
    a coherent light source including a surface-emitting laser, the surface-emitting laser being configured to output a zero-order mode light and a plurality of higher-order mode lights;
    a controller that is configured to superimpose a microwave on the zero-order mode light so as to make the zero-order mode light have a first resonance light and a second resonance light;
    an atom cell in which an alkali metal gas is enclosed;
    a mode filter that is configured to cut the plurality of higher-order mode lights and pass the zero-order mode light therethrough, the mode filter being placed between the coherent light source and the atom cell along an optical axis of the coherent light source; and
    a light receiver that is configured to receive light transmitted through the atom cell so as to output a signal corresponding to the received light,
    wherein
    the mode filter is configured by a light shielding plate having a pinhole on the optical axis.

2. The quantum interference device according to claim 1, wherein the light shielding plate has a metal light shielding region that is configured to prevent the plurality of higher-order mode lights from passing therethrough.

3. The quantum interference device according to claim 1, wherein the light shielding plate has a light shielding region in which a light absorbing member is formed, and the light shielding region is configured to prevent the plurality of higher-order mode lights from passing therethrough.

4. The quantum interference device according to claim 1, further comprising:
    a $\lambda/4$-wave plate placed between the coherent light source and the atom cell,
    wherein the $\lambda/4$-wave plate is configured to circularly-polarize the zero-order mode light.

5. The quantum interference device according to claim 1, further comprising:
    a neutral density filter placed between the coherent light source and the atom cell,
    wherein the neutral density filter is configured to adjust an intensity of the zero-order mode light.

6. An atomic oscillator comprising:
    the quantum interference device according to claim 1; and
    a clock generator that is configured to output a clock signal,
    wherein the controller is configured to make the clock generator generate the clock signal based on the signal from the light receiver.

7. An atomic oscillator comprising the quantum interference device according to claim 2; and
    a clock generator that is configured to output a clock signal,
    wherein the controller is configured to make the clock generator generate the clock signal based on the signal from the light receiver.

8. An atomic oscillator comprising the quantum interference device according to claim 3; and
    a clock generator that is configured to output a clock signal,
    wherein the controller is configured to make the clock generator generate the clock signal based on the signal from the light receiver.

9. An atomic oscillator comprising the quantum interference device according to claim 4; and
    a clock generator that is configured to output a clock signal,
    wherein the controller is configured to make the clock generator generate the clock signal based on the signal from the light receiver.

10. An electronic apparatus comprising:
    a signal receiver that is configured to receive an external signal;
    the quantum interference device according to claim 1, the quantum interference device being assembled in the signal receiver; and
    a case that houses the receiver.

11. An electronic apparatus comprising:
    a signal receiver that is configured to receive an external signal;
    the quantum interference device according to claim 2, the quantum interference device being assembled in the signal receiver; and
    a case that houses the receiver.

12. An electronic apparatus comprising:
    a signal receiver that is configured to receive an external signal;
    the quantum interference device according to claim 3, the quantum interference device being assembled in the signal receiver; and
    a case that houses the receiver.

13. An electronic apparatus comprising:
    a signal receiver that is configured to receive an external signal;
    the quantum interference device according to claim 4, the quantum interference device being assembled in the signal receiver; and
    a case that houses the receiver.

14. A moving object comprising:
    the quantum interference device according to claim 1; and
    a movable body that houses the quantum interference device.

15. A moving object comprising:
    the quantum interference device according to claim 2; and
    a movable body that houses the quantum interference device.

16. A moving object comprising:
    the quantum interference device according to claim 3; and
    a movable body that houses the quantum interference device.

* * * * *